United States Patent [19]

Faris

[11] Patent Number: 4,739,633

[45] Date of Patent: Apr. 26, 1988

[54] ROOM TEMPERATURE TO CRYOGENIC ELECTRICAL INTERFACE

[75] Inventor: Sadeg M. Faris, Yorktown Heights, N.Y.

[73] Assignee: Hypres, Inc., Elmsford, N.Y.

[21] Appl. No.: 796,841

[22] Filed: Nov. 12, 1985

[51] Int. Cl.$^4$ .................... F25B 19/00; H01L 25/04

[52] U.S. Cl. .................... 62/514 R; 357/83; 174/15 CA

[58] Field of Search ............ 62/514 R, 45, 55, 259.2; 324/158 F, 71.5, 71.6; 333/99 S; 165/80.2; 357/80, 81, 82, 83; 174/15 CA

[56] References Cited

U.S. PATENT DOCUMENTS

| | | |
|---|---|---|
| 3,079,504 | 2/1963 | Hutchens . |
| 3,560,893 | 2/1971 | Wen . |
| 3,644,803 | 2/1972 | Levi . |
| 3,696,627 | 10/1972 | Longsworth . |
| 3,706,208 | 12/1972 | Kadi et al. . |
| 3,894,403 | 7/1975 | Longsworth .................... 62/55 |
| 4,190,106 | 2/1980 | Dunmire et al. . |
| 4,401,900 | 8/1983 | Faris .................... 307/352 |
| 4,441,088 | 4/1984 | Anderson . |
| 4,450,693 | 5/1984 | Green et al. . |
| 4,459,823 | 7/1984 | Josephs et al. . |
| 4,498,046 | 2/1985 | Faris .................... 324/158 F |
| 4,587,563 | 5/1986 | Bendell et al. .................... 62/259.2 |

OTHER PUBLICATIONS

Hamilton, "Analog Measurement Applications for High Speed Josephson Switches," IEEE Trans. on Magnetics, vol. MAG-17 (1/81) pp. 577–582.
Hamilton, "High-Speed, Low-Crosstalk Chip Holder for Josephson Integrated Circuits," IEEE Trans. on Instrumentation and Measurement, vol. IM-31 (6/82), pp. 129–131.
P. Wolf, "Picosecond Sampling with Josephson Junctions," in *Picosecond Electronics and Optoelectronics* (ed. Mourou et al.), pp. 236–243, at 241 (1985).
Model LT-3-110 Liquid Transfer Heli-Tran Refrigerators Operating Manual, The Advanced Products Dept., Air Products and Chemicals, Inc.
Models LT-3-110 and LT-3B-110 Heli-Tran Liquid Transfer Refrigeration Systems Technical Manual, Air Products and Chemicals Inc., Sep. 1984.

H. Seifert, "Liquid Helium Cooled Sample Stage for Scanning Electron Microscope".
P. A. Moskowitz et al., "Cryosampler Interface," IBM Research Report No. RC 9614 (#42408) (Oct. 1, 1982).
P. A. Moskowitz et al., "Superconducting Electronics Testing," IBM Research Report No. RC 9519 (#42090) (Aug. 18, 1982).
L. S. Shirshev and G. Enderlein, "1 KA Current Lead-Ins for Superconducting Solenoids Operating in Transportable Dewar Vessel," Institute of High-Energy Physics, Serpukhov. pp. 1336–1338. (Plenum Publishing Corp. 1982) (translated from Pribory i Tekhnika Eksperimenta, No. 5, pp. 220–221, Sep.–Oct. 1981) (Original article submitted Sep. 19, 1980).
J. Chaussy et al., "Easily Demountable Elastomer Seal for Cryogenic Applications," Cryogenics, p. 501 (Aug. 1978).

*Primary Examiner*—Henry A. Bennet
*Attorney, Agent, or Firm*—Kenyon & Kenyon

[57] ABSTRACT

Apparatus is disclosed for electrically interfacing a circuit operable at one temperature with a circuit operable at another temperature, comprising a primary cooling or heating surface disposed inside a vacuum chamber which is thermally connected to the first circuit. Transmission lines may extend through the wall of the vacuum chamber to the second circuit which can be located outside. In one embodiment, the first circuit is operable at cryogenic temperatures and is fabricated on an elongated fused quartz substrate together with the transmission lines. The first circuit may be thermally connected to the primary surface via a secondary surface, which may itself be thermally connected to the primary surface via a flexible support and/or a thermal switch. The use of a flexible element in the construction of the apparatus prevents thermally induced movement from shattering the substrate. The primary surface may be cooled by a thermally conductive rod immersible in liquid helium; by the forced flow of liquid helium into a vessel located inside the vacuum chamber, the interior of which vessel is in thermal communication with the primary surface; by a closed cycle refrigerator; or by other means.

30 Claims, 3 Drawing Sheets

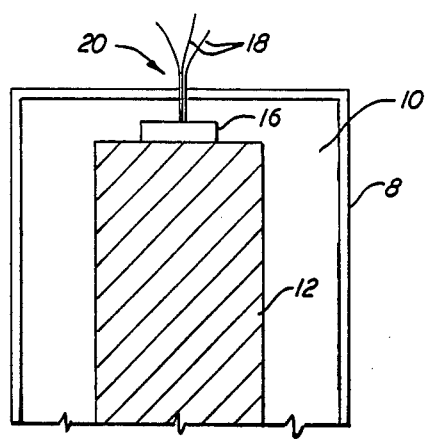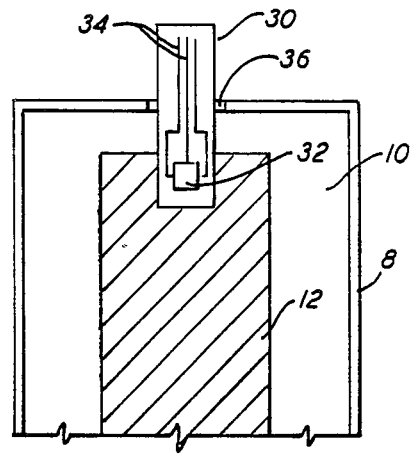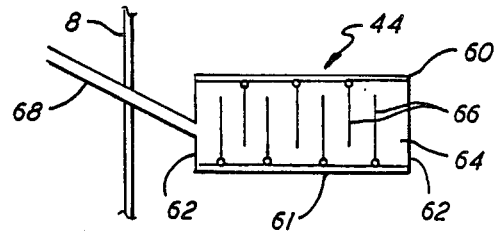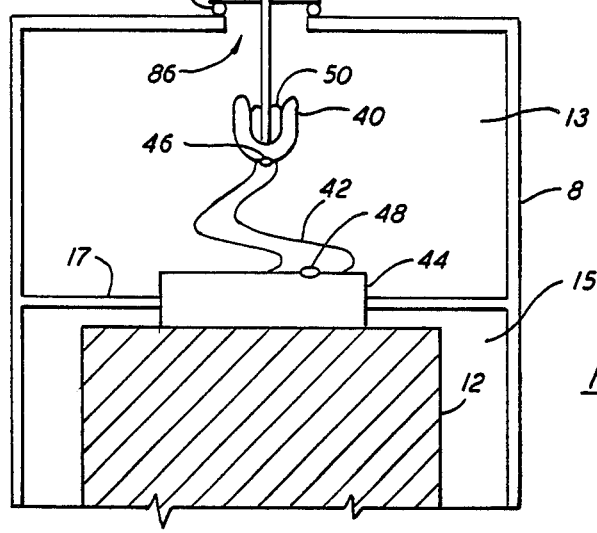
FIG. 1
FIG. 2
FIG. 4
FIG. 3

ROOM TEMPERATURE TO CRYOGENIC ELECTRICAL INTERFACE

BACKGROUND OF THE INVENTION

1. Field of the Invention

The invention relates to apparatus for operating high speed electronic devices at cryogenic temperatures, and more particularly, for interfacing such devices electrically to room temperature apparatus.

2. Description of Related Art

U.S. Pat. No. 4,401,900 to Faris, entitled "Ultra High Resolution Josephson Sampling Technique," shows a sampling technique with a time resolution of 5 picoseconds and sensitivity of 10 uV. This was demonstrated experimentally using a cryogenic sampling system. The time resolution of this system is extendable to the subpicosecond domain, limited ultimately by the intrinsic switching speed of the Josephson device used as the sampling gate. This switching speed can in principle be as little as 0.09 picoseconds. The sampling technique is not restricted to measuring only those waveforms produced in a cryogenic environment. Rather, it can be used to measure waveforms from various sources, such as x-rays, optical photons, or electrical waveforms produced by room-temperature sources, if a suitable interface is available.

In order to measure electrical waveforms produced by room temperature devices, or indeed to interface any low temperature electronic device to a room temperature electronic device, the interface scheme must satisfy the electrical, mechanical, and temperature constraints discussed below:

Electrical Constraints. When operating at high frequencies and extremely short pulse durations, any power lost in the transmission line between the low temperature circuit and the room temperature circuit will degrade the signal transfer. This degradation appears as pulse dispersion or pulse spreading. To minimize loss, the transmission lines should be made of a low resistance material, be as short as possible, and have the largest possible cross sectional area. The latter constraint is limited by the further constraint that the width of the transmission line should not exceed the wavelength of the maximum frequency of interest, because larger conductors will waveguide and cause geometric losses.

Mechanical Constraints. Since one end of the transmission line will be operating at extremely low temperatures and the other end will be operating at room temperatures, it is important that the transmission line be able to withstand that temperature difference. Thus, the bond between the transmission line and the low temperature device should be able to withstand that low temperature, and the seal through which the transmission line passes between the low temperature volume and the room temperature volume should also be able to withstand the necessary temperatures. These elements should also be able to withstand repeated cycling from room temperature to low temperature for maintenance, replenishment of helium supply, and general everyday use. Additionally, the temperature coefficient of expansion of the transmission lines should closely match that of the low temperature device, and the construction should be such as to permit the apparatus to tolerate vibration and temperature-induced changes in transmission line length (collectively referred to herein as "movement").

Temperature Constraints. In order to prevent extensive heat transfer from the room temperature volume to the low temperature volume, the transmission lines should be as long as possible. This is directly contrary to the electrical constraints which favor short transmission lines. The transmission lines should also be made of a material which has low thermal conductivity. Since low thermal conductivity usually implies low electrical conductivity, this constraint, too, is contrary to the electrical constraints.

Workers in the field of superconducting electronics typically achieve the necessary temperatures by immersing their circuits in liquid helium. See, for example, Hamilton, "High-Speed, Low-Crosstalk Chip Holder for Josephson Integrated Circuits," IEEE Trans. on Instrumentation and Measurement, Vol. IM-31, pp. 129–131 (1982). The arrangement shown therein involves attaching several coaxial cables to a Josephson Junction chip which is to be immersed in a liquid helium dewar. See also Hamilton et al., IEEE Transactions on Magnetics, MAG-17, pp. 577–582 (1981), in which a low-temperature chip is inserted partially inside a coaxial line to couple the signals therethrough to the room-temperature devices. Although not mentioned in the reference, it is believed that the low-temperature chip is then immersed in liquid helium. Both arrangements are constrained to have large coaxial lines which have high thermal conductivity. In order to avoid heat losses, the lines are therefore constrained to be long. In addition, these arrangements cannot be adapted easily to planar chips. Furthermore, at least the latter system is constrained to couple only one line to a chip, which limits the system in utility.

An attempt to deal with the constraints described above appears in U.S. Pat. No. 4,498,046 to Faris. The interface described therein includes a pass-through liquid-helium-tight vacuum seal which consists of a flange and two half-cylindrical fused quartz portions, unequal in length, which act as a pass-through plug from a liquid-helium filled cryostat to a vacuum chamber. Fused quartz, while thermally non-conductive, forms a low loss dielectric substrate for conductive copper striplines which are patterned on the flat surface of the longer portion. The coefficient of expansion of fused quartz is small and relatively well matched to that of silicon, which is used for Josephson and semiconductor chip substrates.

The two fused quartz half-cylinder portions of the pass-through plug are arranged so that the portion with the copper striplines extends sufficiently beyond its mating half-cylinder portion on both ends to provide two platforms at opposite ends of the plug. The low temperature semiconductor chip or device is mounted on one of these platforms and the room temperature chip or device is mounted on the other. The cylindrical geometry was chosen in order to minimize stress on cement used to seal the chamber wall around the pass-through. The planar nature of the striplines allows low inductance connections to be made directly to the two chips which are also planar. The low inductance contacts are copper spheres or other rigid probes, about 100 um in diameter or smaller, which penetrate solder pads on the chips when forced into contact by mechanical pressure. The wall of the cryostat is sealed around the pass-through with a thin layer of non-conductive cement. In operation, the two chips are mounted on the platforms and the pass-through is inserted through the cryostat wall such that the low temperature chip is immersed in liquid helium in the cryostat and the room temperature chip is disposed inside the vacuum chamber. A heating element and thermocouple are placed near the position of the room temperature chip in order to warm it. This chamber must be evacuated in order to prevent frosting of water and other gases on the plug, and also to provide adequate insulation for the cryostat.

The '046 apparatus has numerous problems which render it costly, unreliable and impractical to use in most applications. First, the only method described in the '046 patent for cooling the low temperature device involves immersing it in liquid helium. It is advantageous, however, to be able to cool such devices using a closed cycle refrigerator (CCR), which is a refrigeration device that is complete unto itself, and is simply plugged into an ordinary AC wall socket.

Second, the apparatus requires at least two seals, one between the cryostat and the vacuum chamber, and one between the vacuum chamber and the external environment. At least the first of these seals is extremely difficult to create, because it must operate at cryogenic temperatures, must be able to be cycled many times between cryogenic and room temperatures, and must be able to withstand a certain amount of vibration without breaking. Due to the small size of the helium atom, it can pass through extremely small cracks in the seal and can even pass through most materials which are not cracked. This severely limits the types of seals which can be used.

Third, since the low temperature chip is fabricated on a silicon substrate and the transmission line is fabricated on a fused quartz substrate, the two elements must usually be made separately and then mechanically and electrically bonded together. These additional steps are costly. In addition, even though their respective temperature coefficients of expansion are close, the mere fact that the materials are different requires some mismatch which degrades the electrical connection and the mechanical reliability of the bond.

Fourth, because multiple sealed layers of chambers and insulating material are required, the transmission line which carries electrical signals between the two chips must be very long.

Fifth, the pass-through of the '046 apparatus has to be cylindrical in order to obtain a good seal. This renders it difficult to manufacture, and requires special geometries such as that shown in FIG. 3E of the '046 patent.

Finally, the chips used in the '046 apparatus cannot be easily plugged in or out in order to change them.

It is known in the field of optics that devices which need to operate at extremely low temperatures may be placed in thermal contact with a cold surface which is inside a vacuum chamber. A product which may be used for this application is the Heli-Tran, made by Air Products and Chemicals, Inc., Allentown, PA. It comprises a flexible insulated tube connected at one end to a liquid helium dewar. The free end of the tube is closed and terminates in a metal block to which a sample may be attached. The sample and the metal block are disposed inside a vacuum chamber attached to the end of the tube. Until now, however, such a product has not been used in connection with a low temperature circuit to be connected with a room temperature circuit by a high performance transmission line. See also U.S. Pat. No. 3,894,403 to Longsworth, in which an apparent variation of the Heli-Tran structure is shown cooling a superconducting magnet. Even there the magnet is immersed in liquid helium.

The inability of the above arrangements to effectively satisfy the constraints described above derives in large measure from a belief among workers in the field that immersion in liquid helium is the only feasible way to cool a low temperature circuit. In fact, however, the method and apparatus of the present invention is far more effective and better satisfies the constraints.

SUMMARY OF THE INVENTION

It is an object of the invention to provide apparatus for electrically interfacing a circuit operated at low temperatures with a circuit operated at room temperatures.

It is another object of the invention to provide an electrical interface not subject to the foregoing problems.

It is another object of the invention to provide a low temperature to room temperature electrical interface which may be used with a closed cycle refrigerator.

It is another object of the invention to provide a low temperature to room temperature electrical interface in which the sealing requirements are manageable.

It is another object of the invention to provide a low temperature to room temperature electrical interface with short transmission lines.

It is another object of the invention to provide a low temperature to room temperature electrical interface in which the low temperature chip and the transmission lines are fabricated on a single substrate.

It is another object of the invention to provide a low temperature to room temperature electrical interface which is pluggable into and out of the operating environment.

The above objects and others are achieved according to the present invention by disposing the low temperature circuit inside a vacuum chamber and in thermal communication with a cooling surface. Transmission lines which are fabricated on the same substrate as the low temperature circuit may pass through the wall of the vacuum chamber to the external environment. A flexible element may be incorporated in the design to accomodate vibration and thermally induced movement of the substrate. In one aspect, the low temperature circuit may be formed on the surface of an elongated fused quartz substrate, at one end thereof, with the transmission lines fabricated on the same substrate. In another aspect of the invention, the low temperature circuit is immersed in thermal grease or another thermally conductive compound in a copper cup which is in thermal communication with the cooling surface. The cup may be attached to the cooling surface through a copper braid or another flexible support. In yet another aspect of the invention, a thermal switch may be provided between the low temperature circuit and the cooling surface. The cooling surface may itself be cooled by any known means, including liquid helium or a CCR.

BRIEF DESCRIPTION OF THE DRAWINGS

FIGS. 1, 2, 3, 5 and 6 schematically depict various embodiments of the present invention.

FIG. 4 schematically depicts a thermal switch which may be used with the present invention.

DETAILED DESCRIPTION

Figure 5:
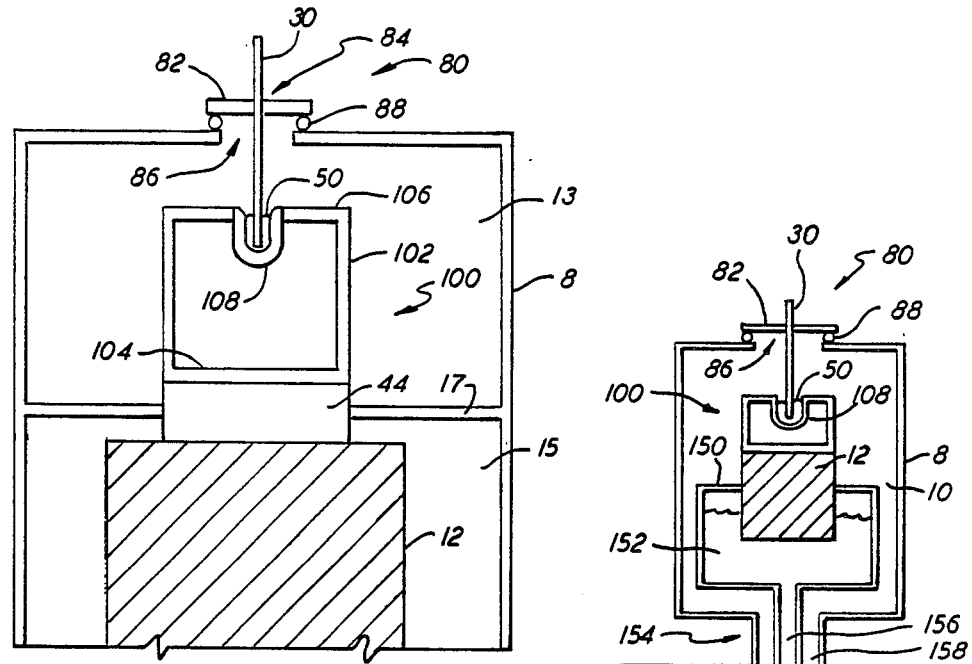

In FIG. 1 there is shown a cross sectional schematic view of an apparatus according to the present invention. A wall 8 encloses a vacuum chamber 10, disposed inside of which is a cooling block 12. The cooling block 12 may be made of copper or another thermally conductive material, and may be cooled by any method including a CCR or a liquid helium filled dewar (not shown). A chip 16 having a low temperature circuit fabricated thereon rests on the outside surface of the cooling block 12, in thermal communication therewith. Thermal grease may be used to improve this connection. A group of transmission wires 18 are electrically connected to solder pads on the chip 16 and extend outward through a seal 20 in the wall 8 of the vacuum chamber 10.

The advantages of this structure over the helium dewar structures are apparent. First, since the chip is mounted directly in the vacuum chamber, the transmission wires do not have to pass through many walls and many chambers before reaching the external environment. The wires therefore can be much shorter than in helium dewar methods.

Second, only one noncritical seal, 20, is required, compared to at least two seals in helium dewar methods. The seal is always at or near room temperature and is not in contact with helium. Since there is no seal between a liquid helium filled chamber and a vacuum chamber, the vacuum can be maintained for a longer period of time.

In FIG. 2 there is shown another embodiment of the present invention, in which the low temperature circuit chip and the transmission lines have been replaced by a planar fused quartz substrate strip 30 passing through the wall 8 of the vacuum chamber 10. The substrate strip 30 is thermally bonded inside the chamber to the cooling block 12. Fused quartz is advantageously chosen for the substrate material because of its low thermal conductivity and low temperature coefficient of expansion. A low temperature circuit, designated 32, is fabricated at the end of the substrate which is inside the vacuum chamber and in thermal communication with the cooling block 12, and transmission lines 34, fabricated on the same substrate, extend longitudinally thereon to the outside. A seal 36 surrounds the substrate at the point that it passes through the wall 8 of the vacuum chamber 10. Since the seal is noncritical, there is no necessity that it be circular or that the transmission line substrate be cylindrical. The seal should, however, be flexible in order to accomodate expansion and contraction of the substrate strip 30. The transmission lines 34 may be made of niobium, in which case they may be fabricated in the same process steps during which the circuit 32 is fabricated.

In FIG. 3 there is shown yet another embodiment of the present invention. In addition to the cooling block 12, there is shown a cup 40 which is thermally connected to the cooling block 12 through a braid 42 and a thermal switch 44 for turning on and off the thermal communication between the cup 40 and the cooling block 12. A dividing wall 17 divides the vacuum chamber 10 horizontally at the switch 44 into an upper chamber 13 and a lower chamber 15. The switch 44 passes through the dividing wall 17 and is hermetically sealed thereto. The cup 40, braid 42, cooling block 12 and the top and bottom surfaces of switch 44 are advantageously all made of the same material, preferably copper, in order to prevent any thermal mismatch. Each element is also welded to the next element with a copper weld, such as that shown as 46 (between the cup 40 and the braid 42) and that shown as 48 (between the braid 42 and the thermal switch 44). The cup 40 is filled with thermal grease 50 or any other suitable material. Since the low temperature circuit may be coated with a dielectric, even electrically conducting materials may be used in the cup 40. Thus, the cup 40 may be filled with thermal grease, zinc oxide in a base, a gallium/tin composite or mercury, to name a few examples.

The thermal switch 44 may compromise any of several thermal switches known in the art. One example, shown in FIG. 4, consists of a round copper plate 60 disposed horizontally and to the top surface of which the braid 42 (not shown in FIG. 4) is welded. The plate 60 is supported by a thin stainless steel cylindrical wall 62 which is welded at its base to a bottom plate 61 in thermal communication with the cooling block 12. The wall 62 therefore defines a chamber 64 between the plates 60 and 61. Inside the chamber 64 is a series of concentric copper fins 66, vertically disposed, which are welded alternately to the underside of the plate 60 and to the top of the plate 61. None of the fins 66 make physical contact with the opposite surface. A pipe 68 passes through the wall 8 of the vacuum chamber 13 and connects the inside of the chamber 64 with a reservoir and vacuum pump (not shown). When it is desired to cool a low temperature circuit which is inserted into the thermal grease 50 in the cup 40, helium or another heat transfer fluid is pumped into the chamber 64 through the pipe 68. Heat then travels through the cup 40, braid 42 and copper plate 60 into the copper fins 66 which are welded to the underside of the plate 60. It then travels through the heat transfer fluid to the alternate fins 66, and down into the bottom plate 61 and the cooling block 12. When it is desired to permit the low temperature circuit to warm, the heat transfer fluid is pumped out of the chamber 64 through the pipe 68, so that heat can no longer travel by conduction between the fins 66. The cylindrical wall 62 is made of a material with low thermal conductivity, so that heat transfer from the plate 60 through the wall 62 to the bottom plate 61 will not severely degrade performance of the switch.

A plug assembly 80 shown in FIG. 3 consists of a cap 82 through which passes the same quartz substrate 30 as is shown in FIG. 2. (Only a side view is shown in FIG. 3.) A noncritical epoxy seal 84 surrounds the substrate 30 at the point where it passes through the cap 82. An additional circuit for operation at room temperature may be fabricated on the end of the substrate 30 which is outside the vacuum chamber 10, and/or connection wires may be bonded to the transmission lines at that end of the substrate strip.

When it is desired to operate a low temperature circuit in conjunction with a room temperature circuit according to the apparatus shown in FIG. 3, a quartz substrate strip 30 is cut and the low temperature circuit and transmission lines are fabricated thereon by a known method. The substrate strip 30 is then inserted through a hole in the cap 82 and sealed in place. The substrate strip 30 and the cap 82 form a plug assembly 80, which is interchangeable with any plug assembly made in the same fashion. With the thermal switch 44 turned off and the thermal grease 50 melted, the plug assembly 80 is inserted through a hole 86 in the wall 8 of the upper vacuum chamber 13, such that the end of the substrate strip 30 on which the low temperature circuit is fabricated extends inwardly and is immersed in the grease 50. The hole 86 is slightly smaller than the cap 82 so that when the cap 82 is placed over the hole 86 it will seal the vacuum chamber 13 in a plug-like manner. The seal may be improved by any of a number of known methods, such as through the use of the O-ring shown as 88 in FIG. 3. The chamber 13 is then evacuated and the low temperature circuit is cooled by turning on the thermal switch 44, permitting the cooling block 12 to draw heat away. The thermal grease 50 may freeze, but this does not significantly affect its thermal conductivity. In addition, any expansion or contraction of any element in the apparatus will be accomodated by the braid 42. When it is desired to remove the low temperature circuit and/or replace it with another, it is not necessary to turn off the refrigeration of the cooling block 12. It is only necessary to turn off the thermal switch 44, permitting the thermal grease 50 to warm up and melt. Air is then let into the upper chamber 13 and the plug assembly 80 removed. Since the lower chamber 15 always remains evacuated, the cooling block 12 neither frosts nor picks up unwanted heat.

Another embodiment of the invention will now be described with reference to FIG. 5. The embodiment shown in FIG. 5 is substantially the same as that shown in FIG. 3, except for the chip holder. Instead of the cup 40, braid 42 and plate 60 shown in FIG. 3, the embodiment of FIG. 5 includes a holder 100 made up of a cylindrical wall 102, a floor 104 attached to the bottom thereof, a flexible washer 106 attached to the top of the wall 102, and a cup 108 hanging down into the cylinder, and supported at its top edge by the inside hole of washer 106. The interior of the cylinder may be evacuated (if the washer 106 and wall 102 are thermally conductive) or filled with a compressible fluid to aid in heat transfer. The cup 108 may be filled, as is the cup 40 in FIG. 3, with thermal grease 50 or another suitable material. If the low temperature circuit is fabricated with niobium, the cup should hang down at least 2 mm. The chip holder 100 fits directly on top of the thermal switch 44, and the fins 66 which depend from the top of the switch 44 may be welded directly to the underside of the floor 104 of the chip holder 100. The cup 108, the cylindrical wall 102 and the floor 104 are made of copper or another thermally conductive material If the washer 106 forms part of the heat transfer path then it, too, should be thermally conductive.

The operation of the embodiment shown in FIG. 5 is much the same as that of the embodiment shown in FIG. 3. That is, a plug assembly 80 including the low temperature circuit and transmission lines is constructed and inserted into the upper vacuum chamber 13 such that the low temperature circuit is immersed in the thermal grease 50. Instead of using the braid 42, however, any vibration or thermal expansion or contraction of the substrate strip 30 is accomodated by the flexible washer 106.

While the primary heat sink described in each of the above embodiments is a cooling block, it should be noted that any cooling surface inside the vacuum chamber will suffice. Similarly, where a secondary cooling surface such as a cup is used, any shape appropriate for heat transfer may be used including a flat surface. The braid 42 of FIG. 3, for example, may itself act as the secondary surface by splitting it at its top into two braids, and pressing them directly against the opposite faces of the substrate strip 30 with some thermal grease. As another example, a solid cooling surface may be split into a number of surfaces, each providing a site for one of several substrate strips to be mounted.

Figure 6:
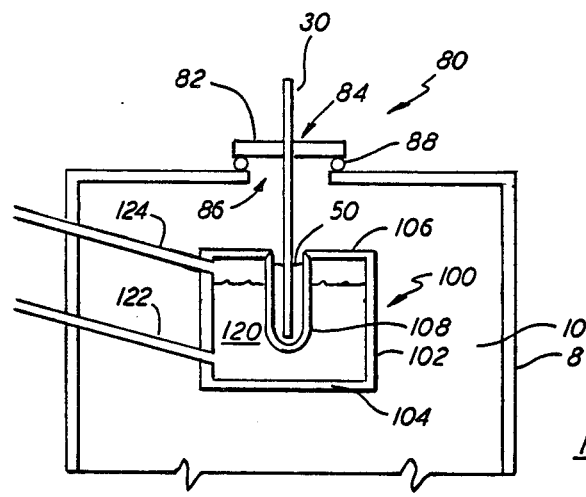

In yet another embodiment, related to that shown in FIG. 5, the chip holder 100 itself doubles as the heat sink. In FIG. 6, the chip holder 100 is shown suspended in the vacuum chamber 10 by thermally resistive means not shown. The interior 120 of the chip holder 100 is now accessible by a pipe 122 for filling the interior 120 with liquid helium. A pipe 124 acts as a vent. A vent such as pipe 124 is usually required for any container intended to hold liquid helium, so as to prevent excessive pressure from building up in the container as the helium boils. Either the washer 106, the cap 82, or the suspension means may be flexible in order to accomodate movement of the substrate The suspension means may also be stretchable. In operation, when it is desired to cool the low temperature circuit on substrate strip 30, the liquid helium is pumped into the interior 120 of the chip holder 100 through pipe 122. The temperature of the circuit can be maintained by pumping additional liquid helium into the interior 120 to replace the helium that boils off. When it is desired to warm the circuit, the helium supply is cut off and the remaining helium is allowed to boil away. No cooling block such as that shown as 12 on FIGS. 1, 2, 3 and 5 is shown in FIG. 6 because its function is accomplished by the cup 108 itself.

Figure 7:
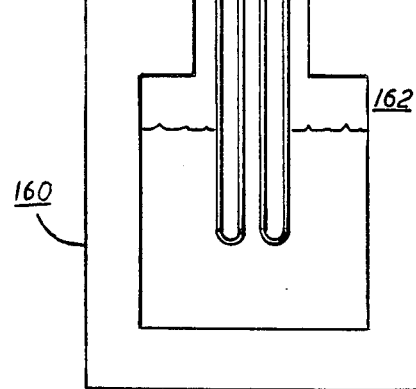
FIGS. 7 and 8 schematically depict apparatus which may be used with the present invention for cooling the cold surface.
Figure 8:
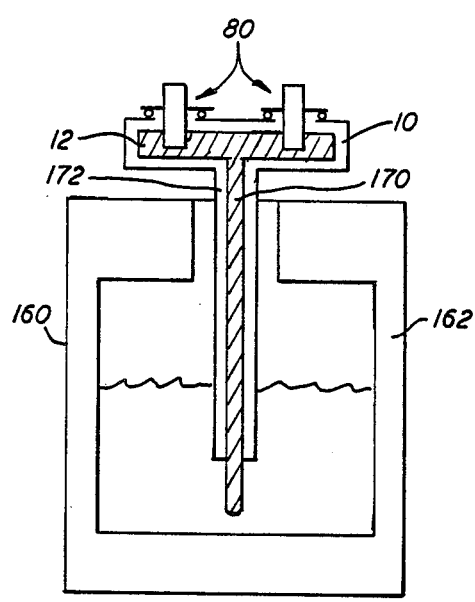

FIGS. 7 and 8 show methods which may be used according to the invention to cool the primary cooling surface in the vacuum chamber. They may also be used to cool any surface in a vacuum chamber, whether or not associated with a low temperature circuit. Referring to FIG. 7, a plug assembly 80 comprising a cap 82 and a substrate strip 30 removably plugs a hole 86 in the wall 8 of the vacuum chamber 10 as in previously described embodiments. The low temperature end of the substrate strip 30 is immersed in thermal grease 50 in a cup 108 of a chip holder 100 such as that described with reference to FIG. 5. At least one element is flexible. The bottom of the chip holder 100 is thermally bonded directly to the top of the cooling block 12. The block 12 depends through a wall 150 of a vessel 152 which is disposed inside the vacuum chamber 10. A vertically extending transfer tube 154 having inner and outer coaxial portions 156 and 158, respectively, is attached to the bottom of the vessel 152 and the vacuum chamber 10, such that the inner portion 156 communicates with the inside of the vessel 152 and the outer portion 158 communicates with the vacuum chamber 10. The transfer tube 154 extends down through the mouth of a liquid helium filled dewar 160 which itself has a vacuum chamber 162 for insulation. The bottom of the inner portion 156 of the transfer tube 154 opens into the liquid helium reservoir in the dewar 160, and the bottom of the outer portion 158 is permanently sealed.

In operation, the dewar 160 is pressurized in order to force liquid helium up the inner portion 156 of the transfer tube 154 and into the vessel 152 where it cools the cooling block 12. The vacuum chamber 10 now not only provides an environment in which the chip 30 is mounted, but also provides insulation for the vessel 152 and the transfer tube 154.

The method shown in FIG. 8 is equivalent and somewhat simpler. For variety two plug assemblies 80 are shown rather than one. The copper cooling block 12 is wide enough to provide two sites for the mounting of chips, and it extends downwardly in the shape of a rod 170 into the liquid helium reservoir in the dewar 160. As with the transfer tube 154 of FIG. 7, the vacuum chamber 10 surrounds the rod 170 in an outer coaxial portion 172 which also extends down into the dewar 160. The outer wall of the coaxial portion 172 may also be constructed appropriately to act as a radiation shield. The effect of the apparatus of FIG. 8 is similar to that of FIG. 7, in that heat from the chip mounting sites is removed via thermal communication with a liquid helium reservoir. It is accomplished, however, without the need for a vessel such as 152 or a means for pressurizing the dewar 160.

Figure 9:
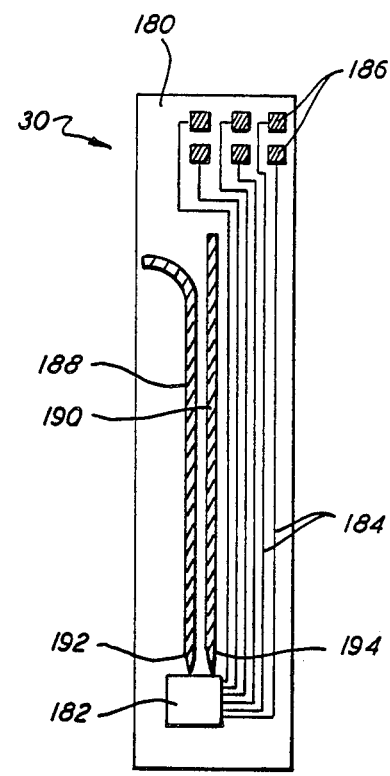
FIG. 9 shows a plan view of a chip which may be used with the present invention.

A monolithic chip which may be used with the present invention will now be described with reference to FIG. 9. It compromises an elongated fused quartz substrate 180, approximately 3 cm long and 0.5 cm wide. A flexible substrate may be used in place of fused quartz if desired, so that the necessity of providing another flexible element in the apparatus to accomodate movement can be avoided. Fabricated at one end of the substrate 180 by a known method is niobium based Josephson Junction circuit 182. Noncritical niobium biasing and monitoring lines 184 connect to the circuit 182 and extend most of the length of the substrate 180 and to a group of connection pads 186. Since high performance is not demanded of the lines 184, the pads may instead be located at the low temperature end of the substrate 180 for bonding to ordinary wires. Two high performance niobium transmission lines 188 and 190 are shown extending from the circuit 182 to the opposite end of the substrate 180 where they may be connected to a room temperature circuit. Since the transmission lines 188 and 190 cannot benefit from superconducting properties, they must be made approximately 1000 um wide in order to maintain the necessary performance. Tapered portions 192 and 194 on transmission lines 188 and 190, respectively, adapt this size to the 2.5 um line widths used in the circuit 182, while maintaining a constant impedance.

In all embodiments described above for the present invention, an object is to achieve the lowest possible temperature for the low temperature circuit, and still permit the use of a high performance transmission line to room temperature. Some low temperature circuits, however, do not require operating temperatures as low as others. For example, a Josephson Junction circuit fabricated with niobium must be operated below the critical temperature of that element of $T_c = 9.2°$ K. But a Josephson Junction circuit fabricated using niobium nitride may be operated up to its critical temperature of $T_c = 16°$ K. Other structures which do not depend on superconducting properties such as gallium arsenide may be operated at higher temperatures. Whenever a higher temperature is permissible, the wider operating margins may be used to relax the construction requirements for apparatus according to the invention. For example, different materials which have lower thermal conductivity may be used for thermally connecting the low temperature circuit to the cooling sink. The physical distance of the low temperature circuit from the cooling sink may also be increased. Additionally, other fluids which have higher boiling points but are easier to handle than helium, such as nitrogen, may be used. Where a CCR is used, a less stringent temperature requirement will permit the use of much more easily obtainable, reliable, compact and inexpensive units. Well known thermal conduction principles will aid the designer in choosing among these various options.

It is noted that all drawings attached hereto are schematic in nature and are not intended to convey specific dimensions.

The invention has been described with respect to particular embodiments thereof, and one skilled in the art can now easily ascertain its essential characteristics. Numerous changes and modifications are possible to adapt it to various usages and conditions, all within the scope of the invention. In particular, it is noted that its general principles are applicable to circuits intended to operate at temperatures different than those described above. The circuit inside the vacuum chamber may be intended to operate at low but non-cryogenic temperatures, or even temperatures above room temperature. The circuit located outside the vacuum chamber may also be intended for operation at any desired temperature. Furthermore, both circuits may be located inside the vacuum chamber. The person of ordinary skill in the art can easily adapt the principles of the present invention to these various situations.

What is claimed is:
1. A monolithic superconductive chip comprising:
  a. a substrate with a low temperature region and a high temperature region;
  b. a low temperature electronic circuit formed on said low temperature region and including an element which is superconductive when it has a temperature below a critical level; and
  c. a plurality of electrical conductors formed on said substrate, said conductors being connected to said electronic circuit and traversing said substrate to said high temperature region.
2. A monolithic superconductive chip comprising:
  a. an elongated substrate having two opposed ends a high temperature and a low temperature region corresponding to one of said ends, respectively;
  b. a low temperature electronic circuit formed on said low temperature region and including an element which is superconductive when it has a temperature below a critical level;
  c. a plurality of contacting pads formed in said high temperature region;
  d. a plurality of biasing and monitoring lines connected between said electronic circuit and one of said contacting pads; and
  e. a plurality of high performance transmission lines connected to said electronic circuit and extending into said high temperature region.
3. An apparatus for maintaining an electronic circuit at a low temperature, comprising:
  a vacuum chamber having an aperture;
  a primary surface disposed within the vacuum chamber;
  cooling means for the primary surface;
  a substrate having a low temperature region, a high temperature region, and a plurality of conductors, the substrate extending through the aperture with the low temperature region disposed substantially within the vacuum chamber and the high temperature region disposed substantially outside the vacuum chamber, the electronic circuit being disposed in the low temperature region, and the plurality of conductors extending from the electronic circuit into the high temperature region; and
  means for coupling the low temperature region of the substrate thermally to the primary surface.

4. Apparatus according to claim 3, wherein the substrate is flexible.

5. Apparatus according to claim 3, wherein the thermal coupling means comprises:
   a secondary surface in thermal contact with the low temperature region of the substrate; and
   thermal connecting means connecting the secondary surface to the primary surface.

6. Apparatus according to claim 5, wherein the thermal connecting means is flexible.

7. Apparatus according to claim 5, wherein the thermal connecting means comprises a braid.

8. Apparatus for electrically interfacing a first circuit operable at a first temperature with a second circuit operable at a second temperature above the first temperature, comprising:
   a vacuum chamber having an aperture;
   a primary surface disposed within the vacuum chamber;
   cooling means for maintaining the primary surface at a third temperature below the first temperature;
   a substrate having a first region on which the first circuit is formed, a second region, and conductor means formed on the substrate, the substrate extending through the aperture, with the first region being disposed substantially within the vacuum chamber and the second region being disposed substantially outside the vacuum chamber, the conductor means having a first end coupled to the first circuit and a second end extending into the second region for electrical coupling to the second circuit; and
   thermal coupling means for coupling the first region of the substrate to the primary surface for maintaining the first region at the first temperature.

9. Apparatus according to claim 3, wherein the primary surface is cooled by a closed cycle refrigerator.

10. Apparatus according to claim 3, wherein the primary surface is cooled by a reservoir of a fluid which boils at a low temperature.

11. Apparatus according to claim 10, further comprising:
    a vessel disposed in the vacuum chamber, the interior of the vessel being in thermal communication with the primary surface; and
    means for transfering fluid from the reservoir into the vessel for cooling the primary surface.

12. Apparatus according to claim 10, further comprising a thermally conductive rod in thermal communication with the primary surface, the rod being immersible in the reservoir.

13. Apparatus according to claim 3, wherein the aperture in the wall is plugable by a cap having a hole sealable around the substrate.

14. Apparatus according to claim 5, wherein the thermal connecting means comprises a rigid, thermally conductive support and a flexible, thermally conductive diaphragm connecting the rigid support to the secondary surface.

15. Apparatus according to claim 5, further comprising a thermal switch between the primary surface and the secondary surface.

16. Apparatus according to claim 8, further comprising means for avoiding substantial degradation of the mechanical, electrical or thermal properties of the first circuit or the conductor means which might otherwise result from movement of the substrate.

17. Apparatus according to claim 16, wherein the aperture comprises a removable cap through which the substrate passes.

18. Apparatus according to claim 17, wherein the means for avoiding substantial degradation comprises the cap, the cap being flexible.

19. Apparatus according to claim 16, wherein the thermal coupling means comprises the means for avoiding substantial degradation.

20. Apparatus according to claim 16, wherein the means for avoiding substantial degradation comprises the substrate, the substrate being flexible.

21. Apparatus according to claim 16, further comprising:
    a secondary surface in thermal contact with the low temperature region of the substrate; and
    means for thermally connecting the secondary surface to the primary surface.

22. Apparatus according to claim 21, wherein the means for avoiding substantial degradation comprises means for flexibly supporting the secondary surface.

23. Apparatus according to claim 21, further comprising a thermal switch between the primary surface and the secondary surface.

24. Apparatus according to claim 8, further comprising:
    a vessel disposed inside the vacuum chamber, the interior of the vessel being in thermal communication with the primary surface; and
    fluid transfer means connected at one end to the interior of the vessel and connectable at the other end to a reservoir of cold fluid, the vacuum chamber extending coaxially with the fluid transfer means, so that pressurization of the reservoir will force fluid therefrom into the vessel for cooling the primary surface.

25. Apparatus according to claim 8, further comprising heat transfer means, a first end of which is in thermal communication with the primary surface, and a second end of which is immersible in a reservoir of cold fluid, the vacuum chamber extending coaxially therewith but terminating short of the second end thereof.

26. A monolithic superconductive chip comprising:
    a. a substrate having a low temperature region and a high temperature region;
    b. a low temperature electronic circuit formed on said low temperature region and including an element which is superconductive when it has a temperature below a critical level; and
    c. a plurality of electrical conductors formed on the substrate and having ends connected to said electronic circuit; said conductors extending into said high temperature region and including high performance transmission lines, and non-critical biasing and monitoring lines.

27. The chip of claim 26 wherein said substrate is fused quartz.

28. The chip of claim 26 wherein said substrate is flexible to compensate for thermal expansion.

29. The chip of claim 26 wherein at least one of said electronic circuit and said transmission lines contains niobium.

30. The chip of claim 26 further comprising contacting pads in said high temperature region terminating said non-critical lines.

* * * * *

UNITED STATES PATENT AND TRADEMARK OFFICE
CERTIFICATE OF CORRECTION

PATENT NO. : 4,739,633

DATED : April 26, 1988

INVENTOR(S) : S. Faris

It is certified that error appears in the above-identified patent and that said Letters Patent is hereby corrected as shown below:

Column 4, line 44, change "accomodate" to --accommodate--.

Column 5, line 53, change "accomodate" to --accommodate--.

Column 7, line 16, change "accomodated" to --accommodated--.

Column 7, line 48, change "material If" to --material. If--.

Column 7, line 59, change "accomodated" to --accommodated--.

Column 8, lines 17-18, change "accomodate" to --accommodate--.

UNITED STATES PATENT AND TRADEMARK OFFICE
CERTIFICATE OF CORRECTION

PATENT NO. : 4,739,633

DATED : April 26, 1988

INVENTOR(S) : S. Faris

It is certified that error appears in the above-identified patent and that said Letters Patent is hereby corrected as shown below:

Column 9, line 21, change "accomodate" to --accommodate--.

Column 10, line 36, change "ends a" to --ends, a--.

Signed and Sealed this

Fourth Day of October, 1988

Attest:

DONALD J. QUIGG

*Attesting Officer*  *Commissioner of Patents and Trademarks*